(12) United States Patent
Maruyama et al.

(10) Patent No.: US 7,233,096 B2
(45) Date of Patent: Jun. 19, 2007

(54) MULTILAYER PIEZOELECTRIC ELEMENT AND VIBRATION-WAVE DRIVE DEVICE

(75) Inventors: Yutaka Maruyama, Tokyo (JP); Nobuyuki Kojima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 159 days.

(21) Appl. No.: 10/985,374

(22) Filed: Nov. 10, 2004

(65) Prior Publication Data
US 2005/0104476 A1 May 19, 2005

(30) Foreign Application Priority Data
Nov. 13, 2003 (JP) ............... 2003-383896
Oct. 13, 2004 (JP) ............... 2004-299072

(51) Int. Cl.
*H01L 41/08* (2006.01)
(52) U.S. Cl. ............... 310/323.02; 310/323.12
(58) Field of Classification Search ........... 310/323.02, 310/323.12, 323.16, 328, 358, 3
See application file for complete search history.

(56) References Cited

U.S. PATENT DOCUMENTS

| | | | |
|---|---|---|---|
| 5,191,688 A * | 3/1993 | Takizawa et al. | .......... 29/25.35 |
| 5,698,930 A | 12/1997 | Takagi | |
| 5,770,916 A | 6/1998 | Ezaki | |
| 6,046,526 A | 4/2000 | Maruyama | |
| 6,841,919 B2 * | 1/2005 | Akahane et al. | ....... 310/316.01 |
| 6,897,598 B2 * | 5/2005 | Kato et al. | ............. 310/323.02 |
| 7,061,159 B2 * | 6/2006 | Funakubo | ............... 310/323.12 |
| 7,067,958 B2 * | 6/2006 | Johansson et al. | ..... 310/323.11 |

* cited by examiner

*Primary Examiner*—Mark Budd
(74) *Attorney, Agent, or Firm*—Canon U.S.A. Inc. I.P. Div

(57) ABSTRACT

A vibration-wave drive motor incorporating a multilayer piezoelectric element having reduced vibration damping as well as a design lending itself to reduced manufacturing costs and miniaturization. The multilayer piezoelectric element includes a piezoelectric active part formed by a plurality of piezoelectric layers having an internal electrode, and a piezoelectric inactive part formed by an integrated piezoelectric layer with no internal electrodes. The vibration-wave drive motor consists of a vibration body including the multilayer piezoelectric element, and a contact body press contacting the vibration body.

15 Claims, 9 Drawing Sheets

MULTILAYER PIEZOELECTRIC ELEMENT AND VIBRATION-WAVE DRIVE DEVICE

BACKGROUND OF THE INVENTION

1. Field of the Invention

This invention relates to a multilayer piezoelectric element, and more particularly to a vibration-wave drive device.

2. Description of the Related Art

Piezoelectric material having an electrical-mechanical energy conversion function for converting electrical energy into mechanical energy is being used for various purposes. In particular, multilayer piezoelectric elements formed by laminating, integrating and sintering multiple layers of piezoelectric material are being used. A laminated layer results in large deformation distortions and large forces with a low applied voltage as compared to a piezoelectric element consisting of a single plate-shaped piezoelectric body. Also, the thickness of a laminated layer can be larger so that a small high-performance multilayer piezoelectric element can be easily manufactured.

For example, U.S. Pat. Nos. 6,046,526 and 5,770,916 dislose manufacturing techniques for a vibration-wave motor serving as a vibration-wave drive device. In particular, disclosed is a multilayer piezoelectric element serving as a multilayer electrical-mechanical energy conversion element constituting part of a vibration body of the vibration-wave motor formed in a bar shape. For uses other than the vibration-wave motor, many techniques regarding multilayer piezoelectric elements are proposed.

The multilayer piezoelectric element consists of layers of piezoelectric material (formed by a plurality of piezoelectric ceramics) and electrode layers (hereinafter, internal electrodes) provided on the surface of the respective piezoelectric layers and formed by electrode material. The piezoelectric layers and the internal electrodes are multiply laminated and then sintered. After sintering, they are polarized to have a piezoelectric property. That is, it is generally the case for a multilayer piezoelectric element that the plurality of internal electrodes are arranged over the multilayer piezoelectric element and the piezoelectric layer is a piezoelectric active part having a piezoelectric property.

FIG. 9 shows an exploded perspective view of a multilayer piezoelectric element used for a vibration body of a bar-type vibration-wave motor disclosed in U.S. Pat. No. 5,770,916.

In FIG. 9, the multilayer piezoelectric element 40 includes internal electrodes 43 provided on the surfaces of a plurality of piezoelectric layers 42. Connecting electrodes 43a (black parts in the figure) connected to the respective internal electrodes 43 and extending to outer peripheral parts of the piezoelectric layers 42 are formed on the surface of the piezoelectric layers 42. The internal electrodes 43 are arranged such that the outer periphery thereof is within the outer periphery of the piezoelectric layer 42, which is divided into four portions (AG, AG, BG, BG, A+, A−, B+, B+), and the respective internal electrodes 43 formed on the same layer are non-conductive to each other.

For every other piezoelectric layer 42, the connecting electrodes 43a are formed to be axially on the same phase positions of the multilayer piezoelectric element 40 in relation to the internal electrodes 43. The connecting electrodes 43a on the same phase position are connected by outside electrodes 44 as electrodes for continuity among the layers provided to the outer periphery of the multilayer piezoelectric element 40.

A plurality of surface electrodes 45 are provided along the periphery arround the outer periphery of the piezoelectric surface of the top layer constructing the multilayer piezoelectric element 40 and are connected to the outside electrodes 44 provided with matching the phase positions of the connecting electrodes 43a. Direct current is applied to the respective internal electrodes 43 via the surface electrodes 45, and the surface electrode 45 is polarized to provide polarized polarities for enabling the following vibration-wave motor to be driven.

FIG. 10 is a section view of the multilayer piezoelectric element 40 shown in the FIG. 9 combined to a vibration body 51 of a bar-type vibration-wave motor 50.

In FIG. 10, the multilayer piezoelectric element 40 with a penetrating hole in the center has the surface electrode 45 contacting with a flexible circuit board 52 and is arranged between hollow metallic members 53 and 54 constituting the vibration body 51. By inserting and screwing a bolt 55 into the metallic member 54 from the metallic member 53 side, the multilayer piezoelectric element 40 and the flexible circuit board 52 are placed and fixed between the metallic members 53 and 54. The flexible circuit board 52 is connected to the surface electrodes 45 connected to the outside electrodes 44 of the multilayer piezoelectric element 40 and to a drive circuit which is not shown in the figures, and high-frequency voltage for driving is applied to the multilayer piezoelectric element 40.

A rotor 58 contacting the tip of the metallic member 54 by pressing via a spring 56 and a spring support body 57 is arranged on one side of the vibration body 51 in the axial direction, and the rotation output of the vibration-wave motor 50 can be extracted by a gear 59 rotating integrally with the rotor 58.

The drive principle of the bar-type vibration-wave motor 50 is that two bending vibrations axially crossing the vibration body 51 to which the multilayer piezoelectric element 40 is assembled are generated with a time phase difference, so that the metallic member 54 moves in a swiveling manner with the tip of the metallic member 54 constituting the vibration body 51 as a drive section, and so that the rotor 58 as a contact member contacting the metallic member 54 by pressing rotates by frictional contact.

As for a linearly driven vibration-wave motor, Japanese Patent No. 3279021 and U.S. Pat. No. 5,698,930 propose using of a flat plate-shaped vibration body.

FIGS. 11A-C are schematic drawings of a linearly driven vibration-wave motor, in which FIG. 11A is a front view, FIG. 11B is a right side view, and FIG. 11C is a plan view.

In FIG. 11, two piezoelectric elements 62, 63 that concurrently generate longitudinal vibrations and bending vibrations are arranged on one side of the metallic member 61 constituting part of the vibration body. Two projections 64, 65 are formed on the other side of the metallic member 61. The two piezoelectric elements 62, 63 are adhered to an elastic body with adhesive.

High-frequency voltage A and high-frequency voltage B are respectively applied to those two piezoelectric elements 62, 63 and the compound movements of the bending vibrations and the longitudinal vibrations are synthesized, and thereby elliptic motion or circular motion can be generated to the tips of the projections 64, 65. The two piezoelectric elements 62, 63 are polarized to respectively have polarities in the same direction, and the high-frequency voltage A and the high-frequency voltage B have a time phase difference by 90 degrees.

As a result, when the tips of the projections 64, 65 are pressed and contacted to a fixing member 66, the metallic member 61 constituting part of the vibration body moves in relation to the fixing member 66. Accordingly, by pressing and contacting other members to the vibration body, a relative displacement motion is generated therebetween, and the vibration-wave motor can be driven linearly. However, in this case, the piezoelectric elements 62, 63 are single plate-shaped elements and not multilayer piezoelectric elements.

As the vibration-wave motor is compacted, the machining errors of the multilayer piezoelectric element 40 and the metallic members 53, 54 in the vibration-wave motor as shown in FIG. 10 as well as the machining errors of the metallic member 61 and the piezoelectric elements 62, 63 in the vibration-wave motor as shown in FIG. 11 would be larger compared to the entire size of the vibration-wave motor, and it would be difficult to produce in mass volume the vibration-wave motors with stable output because of accumulation of these errors.

It is also difficult to fully adhere a piezoelectric element with the interface or adhesive surface of a metallic member, and thereby, vibration damping is caused at the interface or adhesive surface and the performance of the vibration-wave motor was lowered.

SUMMARY OF THE INVENTION

The present invention is directed to a multilayer piezoelectric element and a vibration-wave drive motor incorporating the same, requiring a small number of parts, being simply assembled even if any needed, and for reducing the manufacturing costs of the vibration-wave motor.

In one aspect, a multilayer piezoelectric element includes a piezoelectric active part formed from a plurality of laminated layers of material having a conversion function for converting electrical quantity into mechanical quantity. The active part also includes an electrode formed on the laminated layers. The element also includes a piezoelectric inactive part laminated and integrated with the active part. The inactive part includes at least one material layer having the electrical-mechanical conversion property.

In another aspect, a vibration-wave drive motor includes a vibration body including the active and inactive parts as disclosed above. The motor also includes a contact body in press contact with the inactive part.

Further features and advantages of the present invention will become apparent from the following description of the embodiments (with reference to the attached drawings).

BRIEF DESCRIPTION OF THE DRAWINGS

FIG. 11A is a front view; FIG. 11B is a right side view; and FIG. 11C is a plan view.

DESCRIPTION OF THE EMBODIMENTS

First Embodiment

Figure 1:
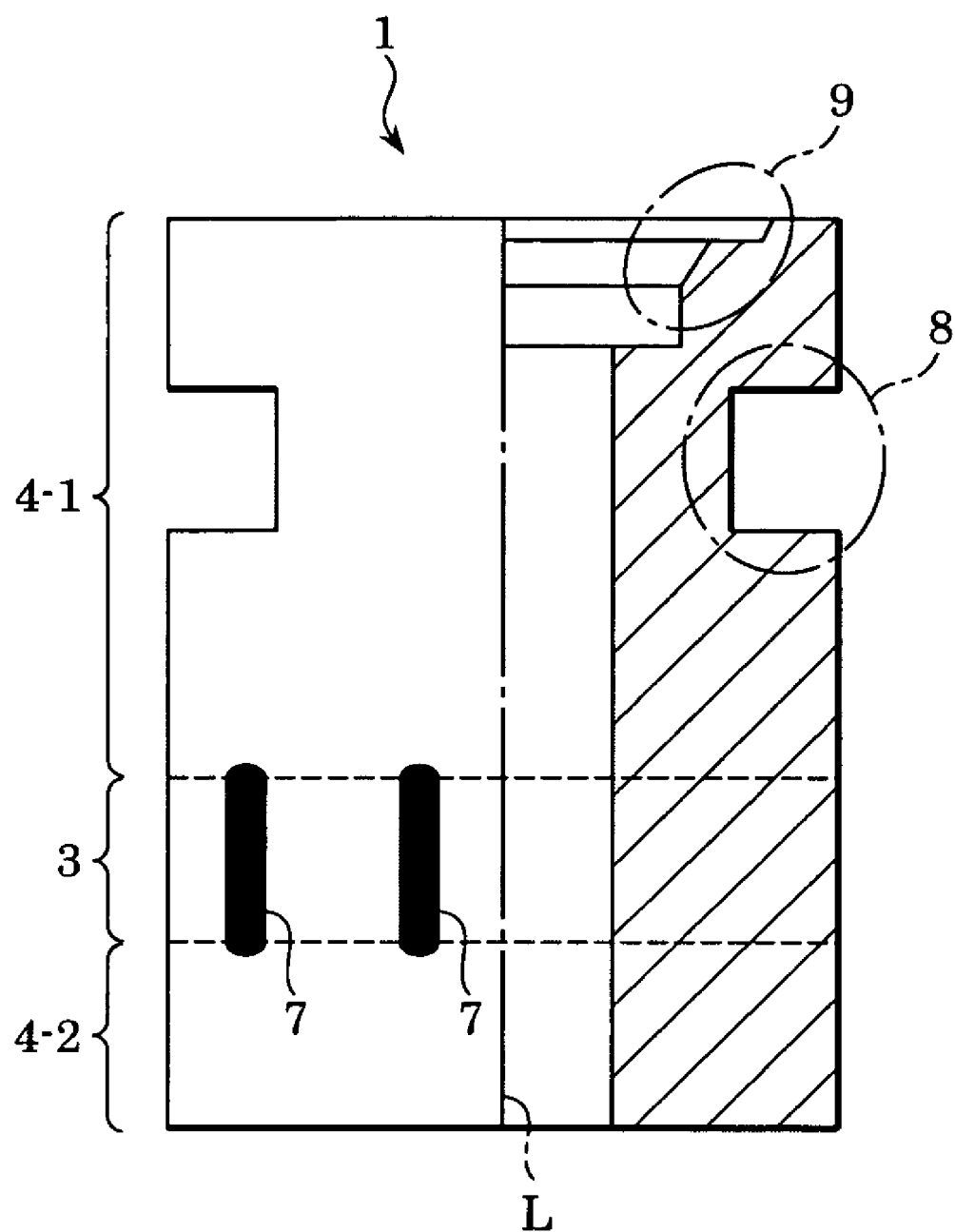
FIG. 1 is a partial sectional view of a multilayer piezoelectric element in accordance with a first embodiment of the present invention.
Figure 2:
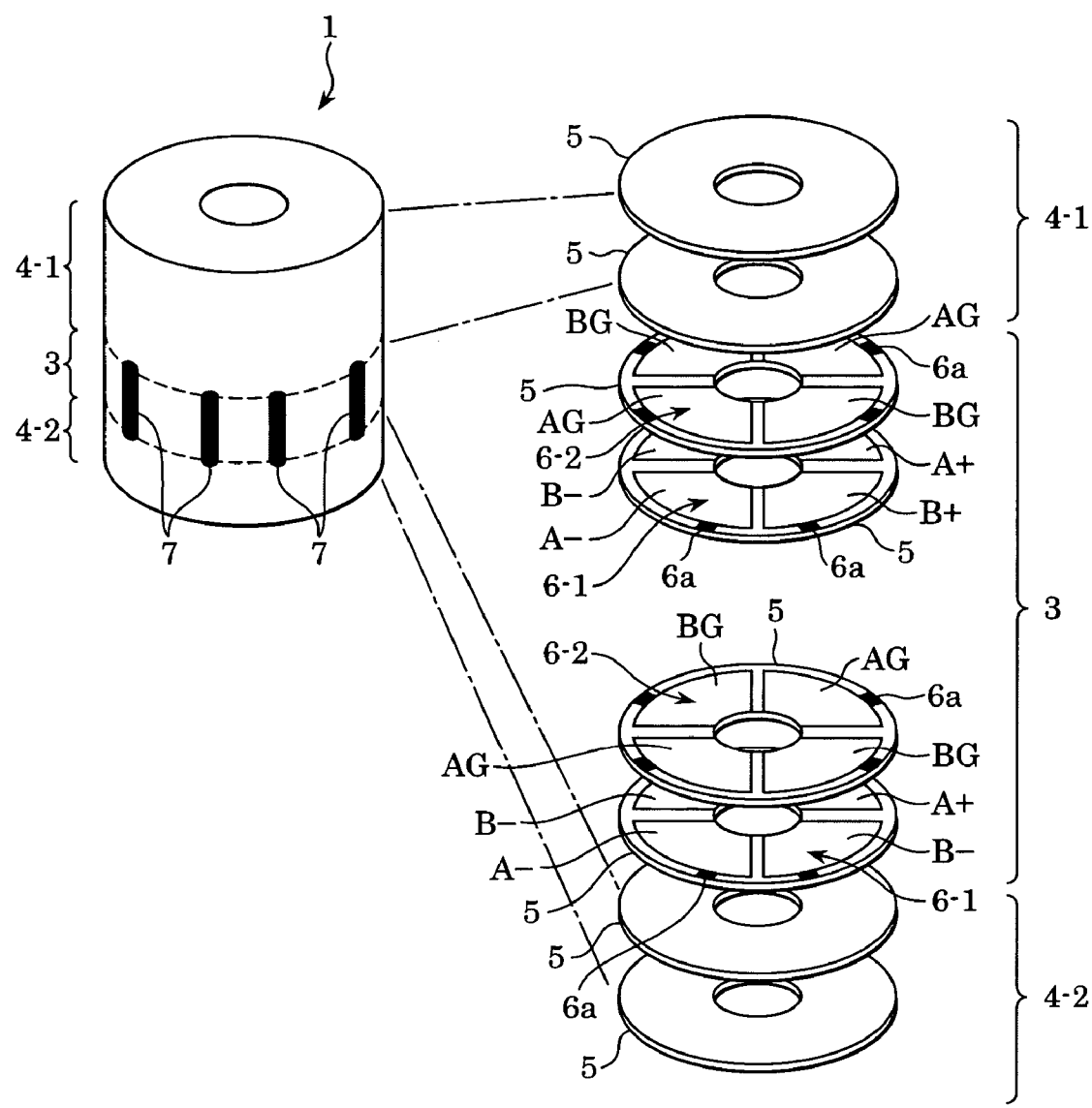
FIG. 2 is a perspective view showing a middle stage of manufacturing of the multilayer piezoelectric element and its lamination structure.

FIG. 1 is a partial section view of a multilayer piezoelectric element as a laminated electrical-mechanical energy conversion element in accordance with a first embodiment of the present invention. The right half of axial line L shows a section view and the left half of the axial line L shows an outline view. FIG. 2 is a perspective view showing a middle stage of manufacturing the multilayer piezoelectric element and its lamination structure. In the description below, the same reference numerals are assigned to the multilayer piezoelectric element in the middle stage of manufacturing and to that after manufacturing for convenience.

In FIGS. 1 and 2, the multilayer piezoelectric element 1 has a cylindrical shape with a penetrating hole in the center. The multilayer piezoelectric element 1 consists of a piezoelectric active part 3 provided between piezoelectric inactive parts 4-1, 4-2. The piezoelectric part 3 includes layers having piezoelectric properties. The part 3 is formed by multiply laminating layers of material having an electrical-mechanical energy conversion function for converting electrical energy (electrical quantity) into mechanical energy (mechanical quantity) and multiply divided layers of electrode material. The piezoelectric inactive part 4-1 is arranged on one side of the piezoelectric active part 3 in the axial direction. The inactive part 4-1 does not have piezoelectric properties and is formed by multiply laminating only the layers of material having the conversion function. The piezoelectric inactive part 4-2 is arranged on the other side of the piezoelectric active part 3 in the axial direction. Likewise, the inactive part 4-2 does not have piezoelectric properties and is formed by multiply laminating solely the layers of material having the electrical-mechanical energy conversion function.

The piezoelectric active part 3 consists of a plurality of piezoelectric layers 5. Internal electrodes 6-1 divided into four portions A+, A−, B+, B− and internal electrodes 6-2 divided into four portions AG, AG, BG, BG are respectively formed on the surface of the plurality of piezoelectric layers 5. Connecting electrodes 6a (black parts in the figure), connected to the respective internal electrodes 6-1, 6-2 and extending to outer peripheral parts of the piezoelectric layers 5, are formed on the layers 5. The connecting electrodes 6a in the respective piezoelectric layers 5 on which the internal electrodes 6-1 are formed are respectively formed axially on the same phase positions of the multilayer piezoelectric element 1, and the connecting electrodes 6a in the respective piezoelectric layers 5 on which the internal electrodes 6-2 are formed are respectively formed axially on the same phase positions of the multilayer piezoelectric element 1.

Outside electrodes 7 are arranged on the outer periphery of the multilayer piezoelectric element 1. The outside electrodes 7 connect the connecting electrodes 6a having the same phase so that there is a continuity between the layers 5. In the embodiment shown in FIG. 2, for example, there are eight outside electrodes 7 for connecting the eight different connecting electrode 6a phases.

The internal electrodes 6-1 of the piezoelectric active part 3 consist of the internal electrodes A+, A−, B+, B−, in which electrodes A+, A− and B+, B− oppose each other in the radial direction, respectively. Likewise, the internal electrodes 6-2 of the piezoelectric active part 3 consists of the internal electrodes AG, AG, BG, BG, in which electrodes AG, AG and BG, BG oppose each other in the radial direction, respectively. The piezoelectric active part 3 is formed by laminating the plurality of piezoelectric layers 5, on which the internal electrodes 6-2, 6-1 are formed, on top of each other.

The piezoelectric inactive part 4-1 and the piezoelectric inactive part 4-2 respectively consist of at least two integrated piezoelectric layers 5 having no internal electrodes. The piezoelectric inactive parts 4-1, 4-2 can have differing thicknesses as shown in FIGS. 1 and 2.

The multilayer piezoelectric element 1 generally has lower resonance frequency as the total length in the multilayer direction is longer while having higher resonance frequency as the diameter is larger. The vibration energy would be larger as the piezoelectric active part 3 is larger, and the costs also increase. Accordingly, the shape of the piezoelectric active part 1 may be designed in a variety of ways according to the required torque, size, or desired frequency of the voltage supplied to the multilayer piezoelectric element 1.

The multilayer piezoelectric element 1 in the present embodiment shows an example of the case when desiring to have an outer diameter of about 10 mm and a length of about 12 mm and has an inner diameter of about 2.8 mm, the thickness of the piezoelectric layer 5 of the piezoelectric active part 3 being about 90 µm, the thickness of the piezoelectric active part 3 being 2.2 mm, the thickness of the internal electrodes 6-1, 6-2 being about 2-3 µm, and 25 layers of the internal electrodes. The outside electrode 7 has a length of about 2.4 mm, width of about 1 mm, and thickness of about 0.05 mm, and the thickness of the piezoelectric layers 5 of the piezoelectric inactive parts 4-1, 4-2 being about 90 µm. It is also possible reduce the number of the piezoelectric inactive parts 4-1, 4-2 by laminating thicker layers.

The multilayer piezoelectric element 1, which consists of piezoelectric ceramics powder and organic binder to be formed into the piezoelectric layers 5, is manufactured by using a green sheet cut out into a shape with a constant size (for example, square of 13×13 in length and width).

First, as shown in FIG. 2, for the piezoelectric inactive parts 4-1, 4-2, a predetermined number of green sheets are solely laminated. The piezoelectric active part 3 is formed by screen-printing a pattern of the internal electrodes 6-1, 6-2 and the connecting electrodes 6a on the green sheets using silver-palladium powder paste. The predetermined number of screen-printed green sheets are stacked, laminated and integrated by pressing with heating.

Next, as shown in FIG. 2, for the laminated multilayer piezoelectric element 1, a penetrating hole is formed by drilling at a position corresponding to the inner diameter of the multilayer piezoelectric element 1. Then, the element 1 is fired in a lead environment at a predetermined temperature (for example, 1100-1200° C.). After firing, both sides are lapped, and both end faces of the multilayer piezoelectric element 1 are smoothed.

Next, as shown in FIGS. 1 and 2, the outer diameter of the multilayer piezoelectric element is machined into a cylindrical shape so that the connecting electrodes 6a are exposed on the outer periphery of the multilayer piezoelectric element 1. Then, using a screen-printer for printing on the cylindrical surface, the outside electrodes 7 are printed on eight positions where the connecting electrodes 6a are exposed on the periphery of the multilayer piezoelectric element 1. After printing, the multilayer piezoelectric element is heated at a predetermined temperature (for example, approximately at 750° C.) and the outside electrodes 7 are baked on the outer periphery of the multilayer piezoelectric element 1.

Next, as shown in FIG. 1, an annular recessed part 8 (recessed part) is formed by cutting the outer periphery (piezoelectric inactive part 4-1) of the multilayer piezoelectric element 1 along the peripheral direction by machining (cutting). Also, a projecting part 9 is formed by cutting so as to partly enlarge the inner diameter from one of the end face sides (piezoelectric inactive part 4-1) in the axial direction of the multilayer piezoelectric element 1.

The recessed part 8 is formed for enlarging the vibration displacement. Since the part where the recessed part 8 is formed is rigidly weak, the upper portion above the recessed part 8 easily vibrates. The projecting part 9 is formed for positioning when a member (for example, metal or ceramics with good abrasion resistance property) is arranged on an end face contacting a rotor 18 (shown in FIG. 3) of the multilayer piezoelectric element 1 by pressing.

The recessed part 8 is formed solely on the piezoelectric inactive part 4-1. The piezoelectric inactive part 4-1 is not provided with an electrode, being different from the piezoelectric active part 3, and it can easily perform fine adjustment of the shape without restriction.

Finally, as shown in FIG. 2, the respective electrodes A+, A−, B+, B−, AG, AG, BG, BG divided into four portions of the internal electrodes 6-1, 6-2 are polarized in a specific polarization direction. More specifically, a metal contact pin is pressed against eight outside electrodes 7. In oil at a predetermined temperature (for example, 100-150° C.), the electrodes AG, BG are grounded G, the internal electrodes A+, B+ are made positive (+), and the internal electrodes A−, B− are made negative (−). A predetermined voltage (for example, 300 V) is applied to the respective electrodes for polarization for about 10-30 minutes.

As a result, as shown in FIG. 2, the multilayer piezoelectric element 1 is polarized for the internal electrodes AG, BG, AG, BG corresponding to electrical grounding such that the internal electrodes A+, B+ are (+) polar and the internal electrodes A−, B− are (−) polar.

Figure 3:
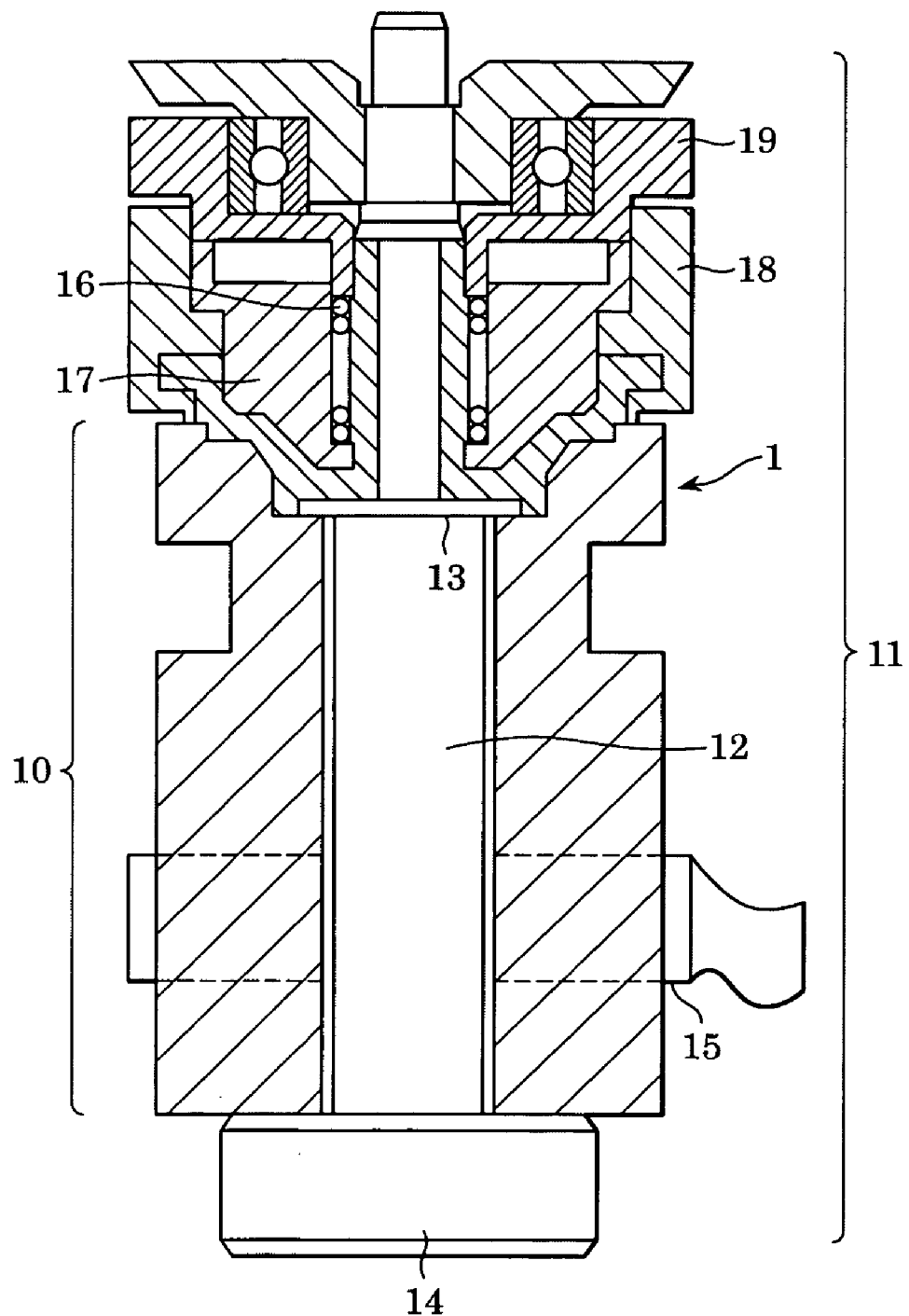
FIG. 3 is a section view of a bar-type vibration-wave motor with the multilayer piezoelectric element assembled thereto.

FIG. 3 is a section view showing a bar-type vibration-wave motor 11 incorporating the multilayer piezoelectric element 1.

In FIG. 3, the vibration-wave motor 11 (vibration-wave drive device) uses the multilayer piezoelectric element 1 as part of a vibration body 10. The vibration body 10 includes a bolt 12 inserted into the inner diameter of the multilayer piezoelectric element 1 for fixing the multilayer piezoelectric element 1 with a flange part 13 of the bolt 12 and a nut 14. A rotor part, which is the upper part of the vibration-wave motor 11, is arranged on the outside of the flange part 13 of the bolt 12. The rotor part includes a rotor 18 (contact body) press contacting an end face of the vibration body 10 via a spring 16 and a spring support body 17, and a gear 19. The rotor 18 is integrally with the gear 19, and the rotation of the rotor 18 can be taken out from the gear 19.

A flexible circuit board 15 is wound around the respective outside electrodes 7 of the multilayer piezoelectric element 1, connecting the respective outside electrodes 7 to drive circuits (not shown in the drawings).

Driving of the vibration-wave motor 11 is performed by making the AG-phase and BG-phase a ground, the electrodes A+, A– A phase, and the electrodes B+, B– B phase having the above mentioned polarity and being in positional relation (AG and AG, BG and BG, A+ and A–, B+ and B–) of axially opposing each other, and applying the A-phase high frequency voltage approximately identical to the eigen frequency of the vibration body 10 and the B-phase high frequency voltage with the phase different from the A-phase by 90 degrees.

With the above application of high frequency, the electrodes A+, A– of the piezoelectric active part 3 alternately expands/contracts in the thickness direction, and similarly, the electrodes B+, B– of the piezoelectric active part 3 expands/contracts in the thickness direction. By converting the expanding/contracting actions of the piezoelectric active part 3 into bending vibrations by the piezoelectric inactive part 4 laminated and integrated on both sides in the axial direction of the multilayer active part 3, two bending vibrations axially crossing the multilayer piezoelectric element 1 can be generated.

Figure 9:
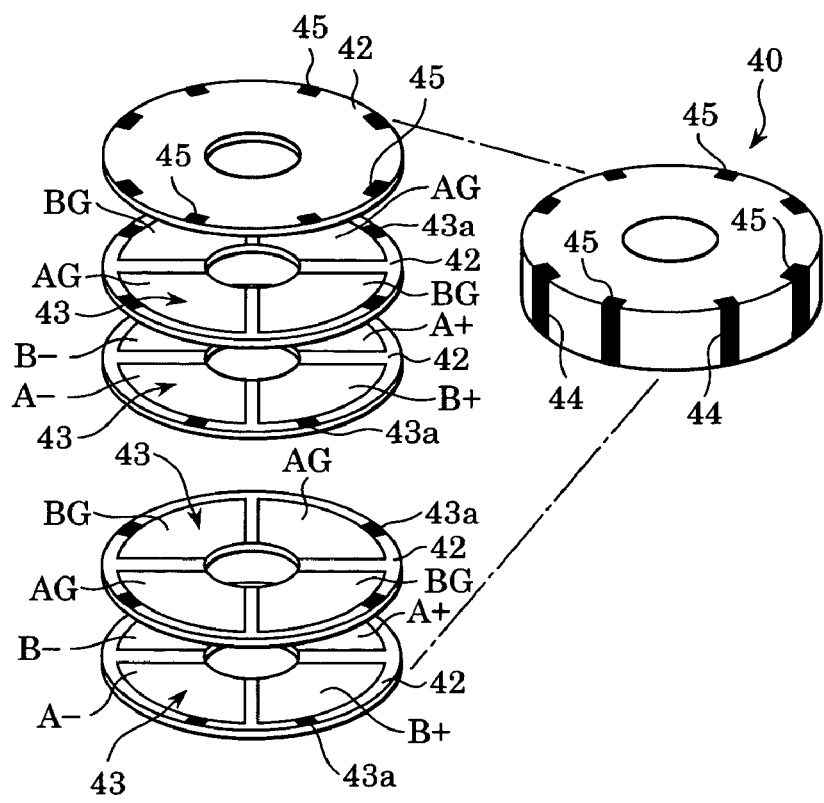
FIG. 9 is a perspective view of a conventional multilayer piezoelectric element.
Figure 10:
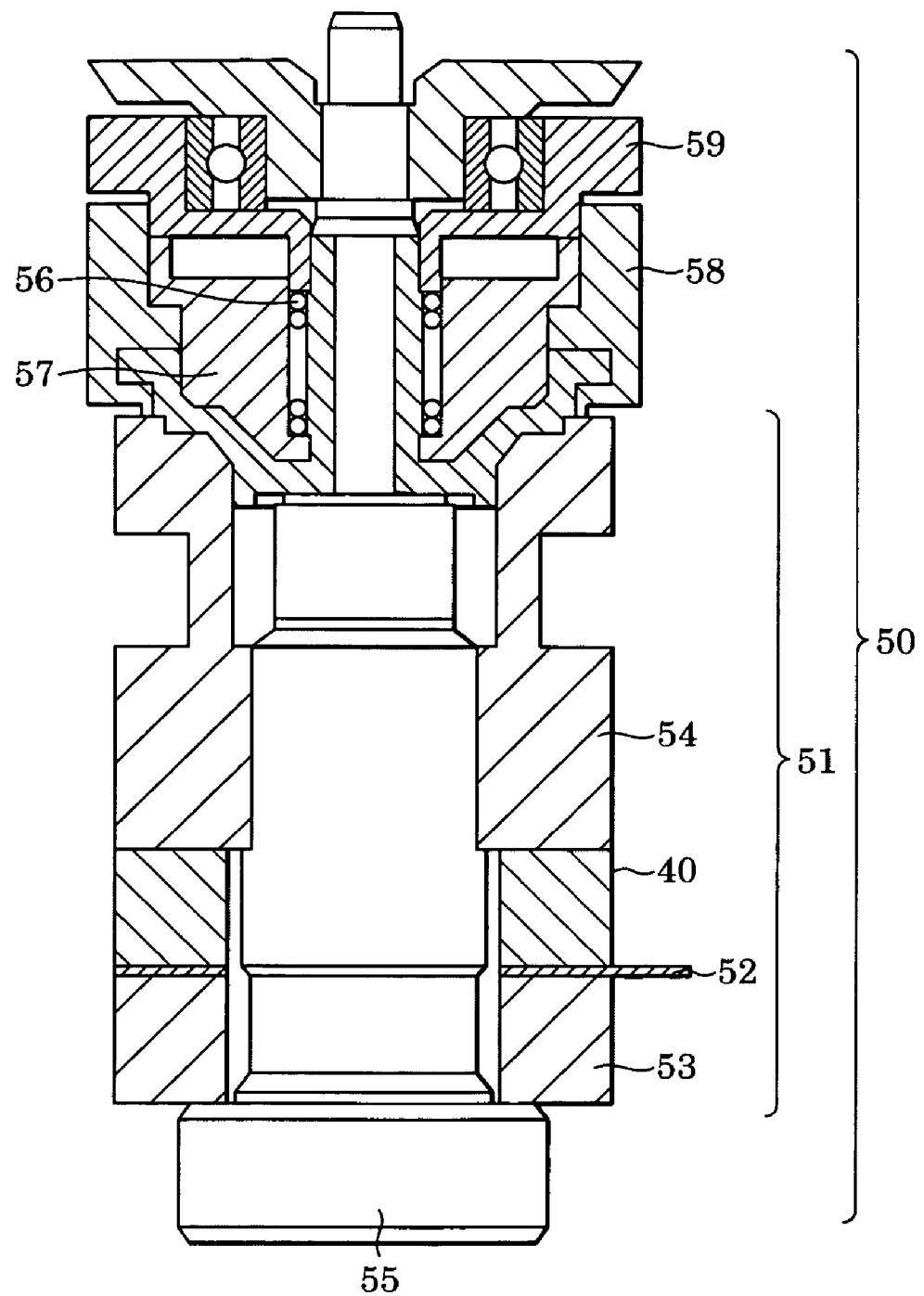
FIG. 10 is a section view of a bar-type vibration-wave motor with the conventional multilayer piezoelectric element assembled thereto.
Figure 11A:
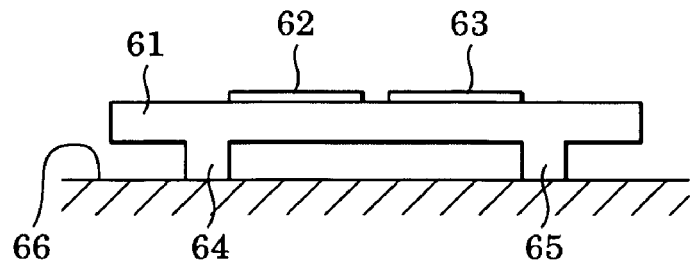
FIGS. 11A-C are drawings showing a linearly driven vibration-wave motor with the conventional multilayer piezoelectric element arranged thereon.
Figure 11B:
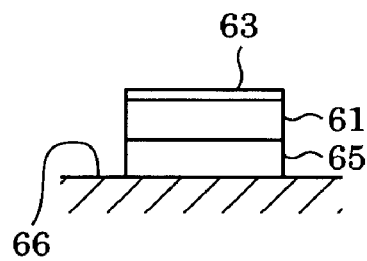
Figure 11C:
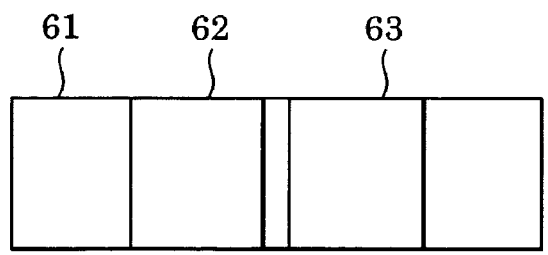

The conventional multilayer piezoelectric element 40 (refer to FIG. 9), which solely expands/contracts in the width direction, generates two bending vibrations by constituting the vibration body 51 by placing and fixing the multilayer piezoelectric element 40 between metal members 53 and 54 (though the multilayer piezoelectric element 40 has two piezoelectric inactive layers as the top and bottom layers which are not polarized for insulation, these layers are thin and generate one vibration or expansion/contraction solely in the thickness direction).

However, since in the multilayer piezoelectric element 1 of this embodiment, the piezoelectric inactive parts 4-1, 4-2 are laminated and integrated with the piezoelectric active part 3 and the piezoelectric active part 3 is placed and fixed between the piezoelectric inactive parts 4-1, 4-2 instead of placing and fixing the multilayer piezoelectric element between metal members as in the conventional element 40. The multilayer piezoelectric element 1 itself is used as the vibration body 10 and can generate the above mentioned two bending vibrations for driving the bar-type vibration-wave motor 11. Those two bending vibrations can cause swiveling using as a drive part the end face of the multilayer piezoelectric element 1 as the vibration body 10, and the rotor 18 press contacting the drive part is rotated by friction.

With this embodiment, it is also possible to improve durability by arranging small parts of metal or ceramics with good abrasion resistance on the end face contacting the rotor 18 in the multilayer piezoelectric element 1.

As described above, in this embodiment, the multilayer piezoelectric element 1 consists of the piezoelectric active part 3 being formed by multiply laminating layers of material with electrical-mechanical energy conversion function and layers of electrode material and having piezoelectric property, and the piezoelectric inactive parts 4-1, 4-2 being formed by multiply laminating only layers of material with electrical-mechanical energy conversion function and not having piezoelectric property, and the thicknesses of the piezoelectric inactive parts 4-1, 4-2 are set large enough to generate two bending vibrations axially crossing the multilayer piezoelectric element 1, and thereby the multilayer piezoelectric element itself can have a plurality of vibration modes (two bending vibration modes).

Accordingly, it is not necessary to assemble metal members for placing and fixing the multilayer piezoelectric element to a vibration-wave motor. Accordingly, vibration damping at an interface between metal members, which reduces the performance of the vibration-wave motor, can be minimized to improve performance of the vibration-wave motor.

Furthermore, since it is not necessary to assemble the metal members to the vibration-wave motor, the vibration-wave motor can be more compact, the performance of the vibration-wave motor is improved, the manufacturing process time period for the vibration-wave motor can be shortened and the number of parts and costs can be reduced.

Furthermore, since the recessed part 8 is formed by machining the outer periphery of the piezoelectric inactive part 4-1, coping with or changing of design specifications such as enlargement of vibration displacement can be properly done, and the piezoelectric material has good workability as compared to metal accordingly to facilitate microprocessing.

As described above, for a vibration-wave motor targeting further compactness and high output power, much effect can be expected for their performance and manufacturing.

In this embodiment, though the recessed part 8 for enlarging vibration displacement formed on the outer periphery of the piezoelectric inactive part 4-1 of the multilayer piezoelectric element 1 is annular, the recessed part 8 can have other shapes permitting enlargement of the vibration displacement.

Second Embodiment

Figure 4:
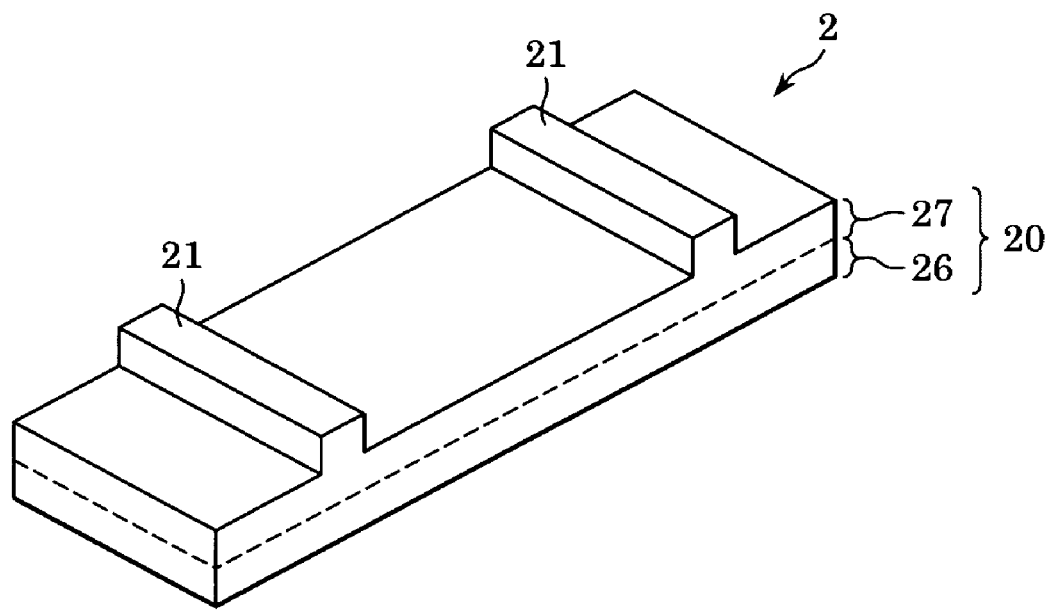
FIG. 4 is a perspective view of a multilayer piezoelectric element in accordance with a second embodiment of the present invention.
Figure 5:
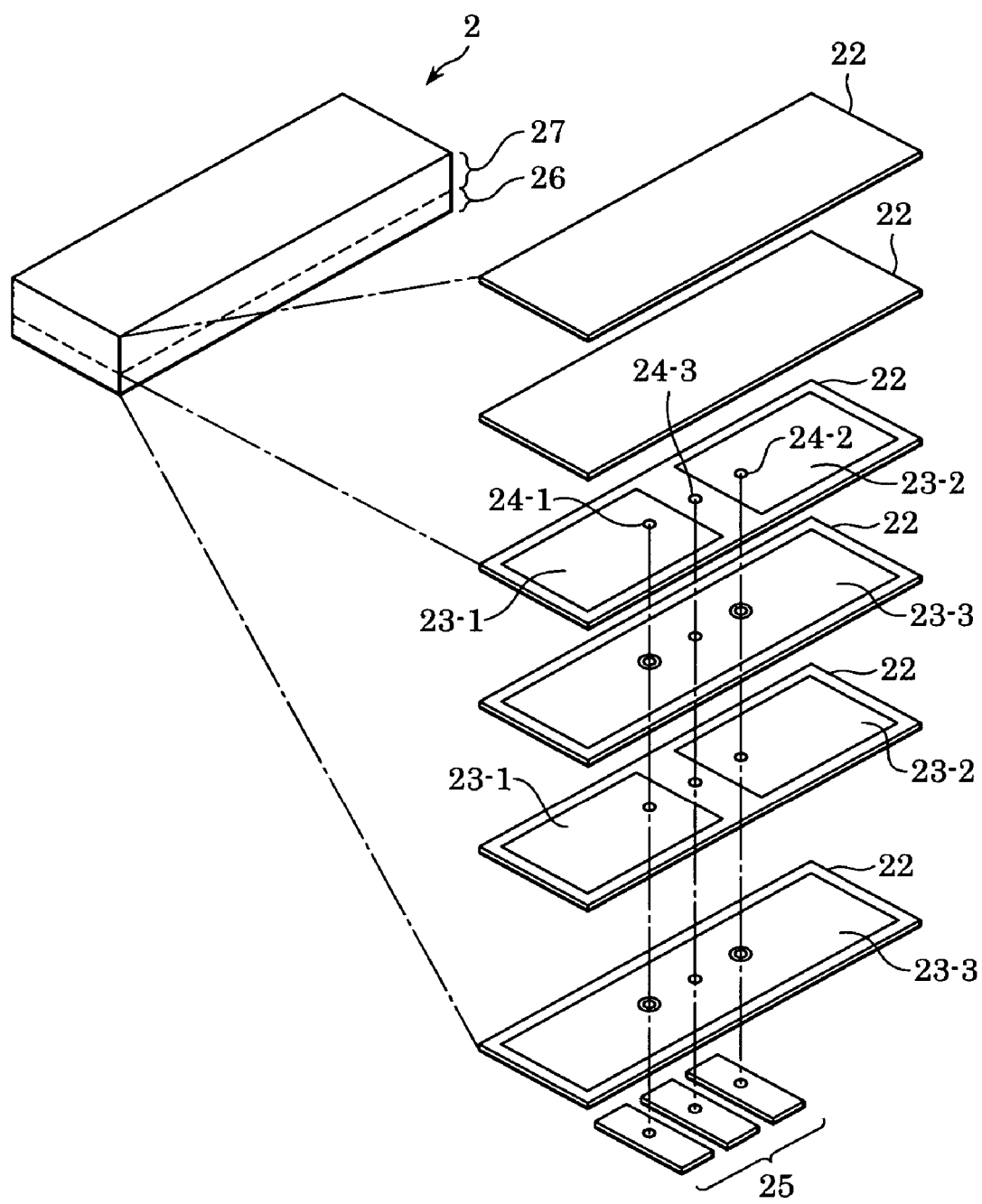
FIG. 5 is a perspective view showing a middle stage of manufacturing of the multilayer piezoelectric element and its lamination structure.

FIG. 4 is a perspective view of a multilayer piezoelectric element in accordance with a second embodiment of the present invention. FIG. 5 is a perspective view showing the multilayer piezoelectric element and its lamination structure. In the description below, the same reference numerals are assigned to the multilayer piezoelectric element in the middle stage of manufacturing and to that after manufacturing for convenience.

In FIGS. 4 and 5, a vibration body 2 has a flat plate-shape before cutting as will be described later. The vibration body 2 consists of a piezoelectric active part 26 and a piezoelectric inactive part 27. The piezoelectric inactive part 27 consists of a number of piezoelectric layers 22 (for example, 20 layers) having no internal electrodes. The piezoelectric active part 26 consists of alternating piezoelectric layers 22 having internal layers 23-1, 23-2 formed into two portions and piezoelectric layers 22 having an internal electrode 23-3 formed entirely on the surface.

The piezoelectric active parts 26 and the piezoelectric inactive parts 27 are, for example coincidently laminated, integrated and fired and constitute a multilayer piezoelectric element 20. The piezoelectric active part 26 is unimorph and the thickness of the piezoelectric inactive parts 27 is set large enough to generate bending vibrations in the multilayer piezoelectric element 20. To be more specific, the thickness is set large enough for the piezoelectric inactive parts 27 not to come to the neutral surface of bending vibrations generated on the multilayer piezoelectric element 20. When the out-of-surface bending vibrations occur on the multilayer piezoelectric element 20 as shown in FIG. 6, the state that the upper side of the multilayer piezoelectric element 20 expands and the lower side contracts and the state that the upper side contracts and the lower side expands are alternately repeated. At that time, the neutral surface with no expansion or contraction exists between the expanding portion and the contracting portion. Since reverse forces of expansion and contraction act on both sides over the neutral surface, for example when the piezoelectric active part 26 made of unimorph comes over the neutral surface, the force canceling the vibration by the piezoelectric active part 26 acts on the upper side of the neutral surface. In other words, it is necessary to set a form for arranging the piezoelectric inactive parts 27 on the neutral surface of the multilayer piezoelectric element 20.

The internal electrodes 23-1, 23-2 are electrically connected to the internal electrodes 23-3 via through holes 24-1, 24-2, 24-3, such that they are continuous with divided surface electrodes 25 arranged on a rear surface of the piezoelectric layer. The electrodes are polarized as described below, and predetermined polarization polarities are provided to the respective piezoelectric layers 22.

As shown in FIG. 4, two projections 21 (projecting parts) are formed by cutting the upper part of the piezoelectric inactive part 27. That is, a vibration body 20 consists solely of the multilayer piezoelectric element 20, which includes the piezoelectric active parts 26 and the piezoelectric inactive parts 27. The two projections 21 enlarge vibration displacement.

The projections 21 are formed solely on the piezoelectric inactive part 27. The piezoelectric active part 26 is not cut since the internal electrodes are formed therein, while microprocessing in the shape can be easily performed on the piezoelectric inactive part 27 since electrodes are not formed therein.

The multilayer piezoelectric element 20 can be connected to a drive circuit (not shown in the drawings) by adhering a flexible circuit board to a predetermined position on the surface after cutting off by lapping surface electrodes 25 arranged on the bottom surface of the multilayer piezoelectric element 20. For example, similarly to the conventional art, the internal electrodes 23-3 of the multilayer piezoelectric element 20 are grounded, and high frequency voltage with time phase difference of, for example, 0-180 degrees is applied to the internal electrodes 23-1, 23-2, 23-3, and thereby two different bending vibrations can be simultaneously generated with time phase difference by 90 degrees as shown in FIG. 6.

Figure 6A:
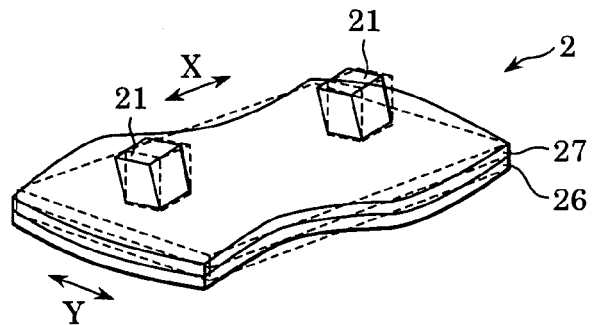
FIGS. 6A-B are diagrams showing two bending vibrations excited by a vibration body in accordance with the second embodiment.
Figure 6B:
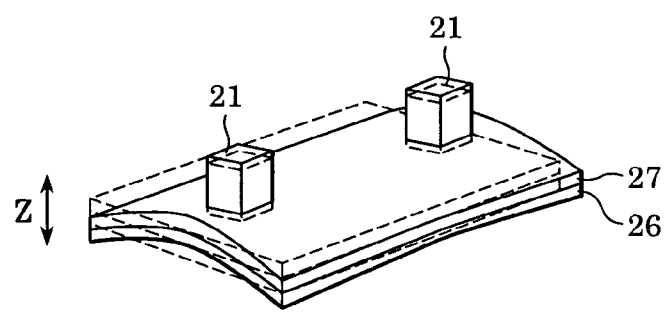

The bending vibrations shown in FIGS. 6A and 6B are outside surface secondary bending vibration and outside surface primary bending vibration, and the shape of the vibration body 2 is designed such that the resonance frequencies of these two bending vibrations are approximately identical. The two projections 21 are arranged near the node of the outside surface secondary bending vibration. With this vibration, the tips of these two projections 21 displace in the X-direction. The two projections 21 are arranged near the antinode of the outside surface primary bending vibration, and with these vibrations, the tips of these two projections 21 displace in the Z-direction. By generating compound vibrations consisting of these two different bending vibrations, elliptic motion or circular motion can be generated to the tips of the two projections 21.

As a result, when the tips of the projections 21 of the vibration body 2 are pressed and contacted to a fixing part (not shown in the drawings), the vibration body 2 moves by itself for the fixing part by the elliptic motion or circular motion generated on the tips. Accordingly, by pressing and contacting other members to the vibration body 2, a relative displacement motion is generated therebetween, and a linearly driven vibration-wave motor can be constituted.

With this embodiment, it is also possible to increase durability by arranging very thin metal or ceramics with good abrasion resistance on the end face contacting the other members at the two projections 21.

The multilayer piezoelectric element 20 of the present embodiment has, for example, a length of about 20 mm, width of about 5 mm and thickness of about 1.8 mm, and the thickness of the piezoelectric layer 22 is about 60 µm, the thickness of the internal electrode is about 1-2 µm and the diameter of the through hole is about 0.1 mm. It is also possible to use thicker sheets for the piezoelectric layers 22 of the piezoelectric inactive part 27. The shape of the piezoelectric active part 20, similarly to the multilayer piezoelectric element 1, may be designed in a variety of ways according to the required torque, size, or desired frequency of the voltage supplied to the multilayer piezoelectric element 1.

The manufacturing method of the multilayer piezoelectric element 20, which is basically the same as the first embodiment, is described below.

First, a green sheet with no internal electrode formed thereon and a green sheet with an internal electrode formed thereon are laminated and integrated. Then, they are fired in a lead environment at a predetermined temperature (for example, 1100-1200° C.).

Next, as shown in FIG. 5, metal pins are respectively pressed against the surface electrodes 25 connected to the three through holes, the internal electrode 23-3 is grounded G, the internal electrodes 23-1, 23-2 are made positive (+), and in oil at a predetermined temperature (for example, 100-150° C.), a predetermined voltage (for example, 200 V) is applied thereon and a polarization process is performed for about 10-30 minutes.

After the polarization process as described above, both sides of the multilayer piezoelectric element 20 are lapped, such that the upper and lower sides of the multilayer piezoelectric element 20 are smoothed and the surface electrodes 25 are cut off. As shown in FIG. 4, the projecting parts 21 are formed by cutting the surface of the piezoelectric inactive part 27 of the multilayer piezoelectric element 20. It is also possible to first perform cutting and then polarization in the process after firing.

In this embodiment, the multilayer piezoelectric element 20 can be solely used as the vibration body 2 for the vibration-wave motor and two different bending vibrations can be simultaneously generated since the multilayer piezoelectric element 20 is formed by laminating and integrating the piezoelectric inactive part 27 with the piezoelectric active part 26 and that the projecting parts 21 for press contacting other members are formed by cutting out the surface of the piezoelectric inactive part 27, which is different from the conventional art in which two different bending vibrations are generated by adhering elastic bodies as metal members and piezoelectric elements.

Since adhesion of the piezoelectric elements and thick metal members as in the conventional art is not needed, vibration damping, which reduces performance of the vibration-wave motor, can be removed and improve the performance of the vibration-wave motor.

Furthermore, since metal members are not used, the vibration-wave motor can be compacted, the performance of the vibration-wave motor is improved, the manufacturing process time period for the vibration-wave motor can be shortened and the number of parts and the costs can be reduced.

Furthermore, since the recessed part 21 is formed by cutting the piezoelectric inactive part 27 constituting the multilayer piezoelectric element 20, coping with or changing of design specifications such as enlargement of vibration displacement can be properly done, and the piezoelectric material has good workability compared to metal accordingly to facilitate microprocessing.

Although in this embodiment the shape of the projections 21 is a rectangular parallelepiped and the number of arrangements is two, this embodiment can have other shapes and number of arrangements of the projections 21 that permit enlargement of the vibration displacement.

Figure 7:
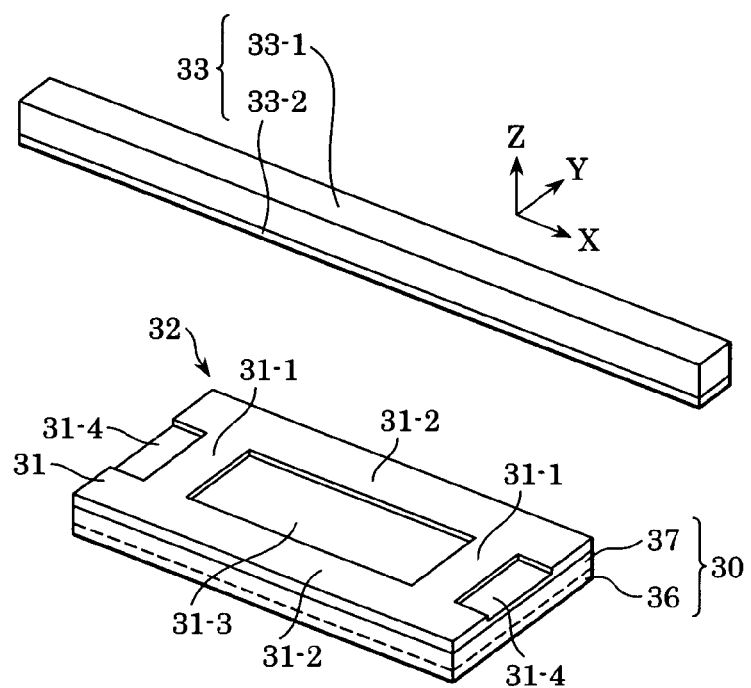
FIG. 7 is a perspective view of a vibration-wave motor using the multilayer piezoelectric element in accordance with the second embodiment.

FIG. 7 is a perspective view of a linear type vibration-wave motor incorporating the multilayer piezoelectric element of the second embodiment. In the multilayer piezoelectric element 30 shown in FIG. 7, a flat plate-type abrasion material 31 is adhered to the upper surface by adhesive instead of forming projections 21 on the upper surface as compared to the multilayer piezoelectric element 20 shown in FIGS. 4 and 6.

In FIG. 7, the multilayer piezoelectric element 30 is flat plate-shaped and consists of a piezoelectric inactive part 36 formed by piezoelectric layers with no internal electrode from the first layer at the top to a predetermined layer (for example, the 20th layer) and a piezoelectric active part 37 formed by piezoelectric layers with the internal electrodes formed similarly as in FIG. 5 from the predetermined layer (for example, the 21st layer) to the bottom layer (for example, the 30th layer). Similarly as the multilayer piezoelectric element 20 as shown in FIG. 4 or 6, the piezoelectric active part 36 and the piezoelectric inactive part 37 are formed by, for example laminating, integrating and firing, and the thickness of the piezoelectric inactive part 37 is set large enough to generate bending vibrations in the multilayer piezoelectric element 30. When the thickness of the piezoelectric inactive part 37 is not large enough, energy generated by the unimorph piezoelectric active part 36 cannot be taken out as bending vibrations.

The plate-shaped abrasion material 31 is connected to the upper surface of the piezoelectric inactive part 37. The abrasion material 31 is made of material having both high frictional coefficient and abrasion durability, such as the material formed by nitriding the surface of SUS420J2 material.

The abrasion material 31 consists of portions 31-1, 31-2 with uniform thickness and portions 31-3, 31-4 that are thinner than the portions 31-1, 31-2. By etching the surface of the plate-shaped SUS420J2 material as abrasion material and reducing the thickness, the thin plate parts 31-3, 31-4 are formed and the other portions are allocated as 31-1, 31-2. The portion 31-1 is formed between the portions 31-3 and 31-4 which are linearly lined up and arranged. A slider 33 includes a slider base part 33-1 and abrasion material 33-2 connected to the slider base part 33-1, and the abrasion material 33-2 contacts a contact part 31-1 by pressing.

Since the thin plate parts 31-3, 31-4 are recessed deeper than the contact part 31-1, thin plate parts 31-3, 31-4 do not contact the slider even when the vibration body 32 is vibration-excited.

The multilayer piezoelectric element 30 can be connected to a drive circuit (not shown in the drawings) by adhering a flexible circuit board to a predetermined position of the multilayer piezoelectric element 30. Two different bending vibrations can be simultaneously generated with time phase difference by 90 degrees as shown in FIGS. 8A and 8B by applying high frequency voltage with time phase difference to the internal electrodes of the multilayer piezoelectric element 30.

Figure 8A:
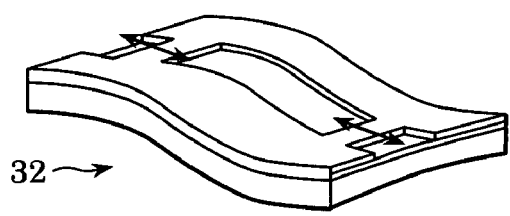
FIGS. 8A-B are drawings showing two bending vibrations excited by a vibration body in accordance with the second embodiment.
Figure 8B:
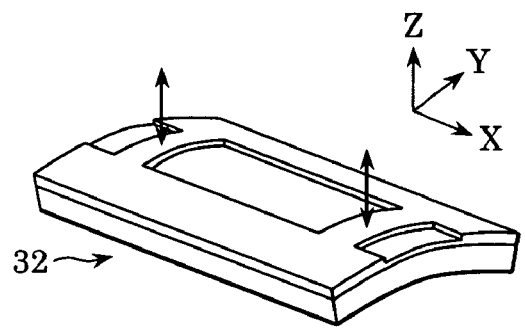

The bending vibrations shown in FIG. 8A are outside surface secondary bending vibrations similar to the bending vibrations shown in FIG. 6A. The bending vibrations shown in FIG. 8B are outside surface primary bending vibrations similar to the bending vibrations shown in FIG. 6B. The shape of the vibration body 32 is designed such that the resonance frequencies of these two bending vibrations are about identical. The two contact parts 31-1 are arranged on similar positions as the two projections 21 shown in FIG. 4. By generating compound vibrations consisting of these two different bending vibrations, elliptic motion or circular motion can be generated at the surface of the two contact parts 31-1 of the piezoelectric inactive part 37.

As a result, when the surface of the contact part 31 of the vibration body 32 is pressed and contacted to the slider 33, the slider 33 moves linearly for the vibration body 32 by the elliptic motion or circular motion generated on the surface. Accordingly, by pressing and contacting the slider 33 to the vibration body 32, a relative displacement motion is generated therebetween, and a linearly driven vibration-wave motor can be constituted.

The multilayer piezoelectric element 30 and the abrasion material 31 constituting the vibration body 32 as shown in FIG. 7 have about the same length (X-direction) and width (Y-direction). The multilayer piezoelectric element 30 has a length of about 5.5 mm, width of about 3.1 mm and thickness of about 0.6 mm. The thickness of the contact part 31-1 of the abrasion material 31 and that of the portion 31-2 are about 0.1 mm, and the thickness of the thin plate parts 31-3, 31-4 is about 0.05 mm. The shape of the piezoelectric active part 30, similarly to the multilayer piezoelectric element 1, may be designed in a variety of ways according to the required torque, size, or desired frequency of the voltage supplied to the multilayer piezoelectric element 1.

In the embodiment shown in FIG. 7, the multilayer piezoelectric element 30 can simultaneously generate two different bending vibrations.

Furthermore, since metal members are not employed, the vibration-wave motor can be compacted, the performance of the vibration-wave motor is improved, the manufacturing process time period for the vibration-wave motor can be shortened and the number of parts and the costs can be reduced.

While the present invention has been described with reference to what are presently considered to be the embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Applications No. 2003-383896 filed Nov. 13, 2003 and 2004-299072 filed Oct. 13, 2004, which are hereby incorporated by reference herein.

What is claimed is:

1. A multilayer piezoelectric element, comprising:
a piezoelectric active part including a plurality of laminated material layers having an electrical-mechanical conversion property, and an electrode defined thereon; and a piezoelectric inactive part laminated and integrated to the piezoelectric active part, the piezoelectric inactive part including at least one material layer having the electrical-mechanical conversion property, wherein the piezoelectric active part is positioned only on one side of a neutral plane of out-of-plane bending vibration generated in the multilayer piezoelectric element.

2. A multilayer piezoelectric element according to claim 1, wherein the piezoelectric inactive part includes at least one of a recessed part and a projecting part facilitating magnifying displacement of vibration.

3. A multilayer piezoelectric element according to claim 1, wherein the piezoelectric inactive part has a thickness that facilitates generating a plurality of vibration modes.

4. A multilayer piezoelectric element according to claim 1, wherein the multilayer piezoelectric element has a substantially cylindrical shape.

5. A multilayer piezoelectric element according to claim 4, wherein the piezoelectric inactive part has a recessed part.

6. A multilayer piezoelectric element according to claim 1, wherein the plurality of vibration modes includes at least two bending vibration modes axially crossing the multilayer piezoelectric element.

7. A multilayer piezoelectric element according to claim 1, wherein the multilayer piezoelectric element has a substantially flat plate shape.

8. A multilayer piezoelectric element according to claim 7, wherein the piezoelectric inactive part has a projecting part.

9. A vibration-wave drive motor, comprising:
a vibration body including:
a piezoelectric active part including a plurality of laminated material layers having an electrical-mechanical conversion property, and an electrode defined thereon;
a piezoelectric inactive part laminated and integrated to the piezoelectric active part, the piezoelectric inactive part including at least one material layer having the electrical-mechanical conversion property; and
a contact body press contacting the piezoelectric inactive part, wherein the piezoelectric active part is positioned only on one side of a neutral plane of out-of-plane bending vibration generated in the multilayer piezoelectric element.

10. A vibration-wave drive motor according to claim 9, wherein the piezoelectric inactive part has a thickness that facilitates generating a plurality of vibration modes.

11. A vibration-wave drive motor according to claim 9, wherein the piezoelectric inactive part includes at least one of a recessed part and a projecting pad facilitating magnifying displacement of vibrations.

12. A vibration-wave drive motor according to claim 10, wherein the vibration body has a substantially cylindrical shape, and wherein the vibration modes includes at least two bending vibration modes that axially cross the vibration body.

13. A vibration-wave drive motor according to claim 11, wherein the vibration body has a substantially cylindrical shape, and wherein the vibration modes includes at least two bending vibration modes that axially cross the vibration body.

14. A vibration-wave drive device according to claim 10, wherein the vibration body has a substantially flat plate shape, and wherein the vibration mode includes a plurality of bending vibration modes.

15. A vibration-wave drive device according to claim 11, wherein the vibration body has a substantially flat plate shape, and wherein the vibration mode includes a plurality of bending vibration modes.

* * * * *